United States Patent
Pan et al.

(10) Patent No.: US 9,006,768 B2
(45) Date of Patent: Apr. 14, 2015

(54) LIGHT EMITTING DIODE HAVING INCREASED LIGHT EXTRACTION

(76) Inventors: Qunfeng Pan, Fujian (CN); JyhChiarng Wu, Hsinchu (TW); Kechuang Lin, Fujian (CN)

(*) Notice: Subject to any disclaimer, the term of this patent is extended or adjusted under 35 U.S.C. 154(b) by 23 days.

(21) Appl. No.: 14/004,081

(22) PCT Filed: Mar. 26, 2012

(86) PCT No.: PCT/CN2012/073024
§ 371 (c)(1),
(2), (4) Date: Sep. 26, 2013

(87) PCT Pub. No.: WO2012/130115
PCT Pub. Date: Oct. 4, 2012

(65) Prior Publication Data
US 2014/0034985 A1  Feb. 6, 2014

(30) Foreign Application Priority Data

Apr. 1, 2011 (CN) .................. 2011 1 0080882

(51) Int. Cl.
| | | |
|---|---|---|
| H01L 33/00 | (2010.01) | |
| H01L 33/10 | (2010.01) | |
| H01L 33/38 | (2010.01) | |
| H01L 33/42 | (2010.01) | |
| H01L 33/20 | (2010.01) | |
| H01L 33/46 | (2010.01) | |

(52) U.S. Cl.
CPC ............ *H01L 33/10* (2013.01); *H01L 33/0079* (2013.01); *H01L 33/20* (2013.01); *H01L 33/38* (2013.01); *H01L 33/382* (2013.01); *H01L 33/42* (2013.01); *H01L 33/46* (2013.01)

(58) Field of Classification Search
CPC ... H01L 33/0079; H01L 33/38; H01L 33/382; H01L 33/42; H01L 33/10
See application file for complete search history.

(56) References Cited

U.S. PATENT DOCUMENTS

2010/0163907 A1* 7/2010 Hsu et al. .................. 257/98

FOREIGN PATENT DOCUMENTS

| CN | 101465402 | * | 7/2008 | ............. H01L 33/00 |
|---|---|---|---|---|
| CN | 100435368 C | | 11/2008 | |
| CN | 101465402 B | | 8/2010 | |
| CN | 102185073 A | | 9/2011 | |

OTHER PUBLICATIONS

PCT/CN2012/073024 International Search Report and Written Opinion, 6 pages.

* cited by examiner

*Primary Examiner* — Benjamin Sandvik
*Assistant Examiner* — Farid Khan
(74) *Attorney, Agent, or Firm* — Patent Law Group LLP; Brian D. Ogonowsky

(57) ABSTRACT

An n-type layer, an active layer, and a p-type layer are grown on a growth substrate. Portions of the p-type layer and active layer are etched away to expose the n-type layer, and an n-electrode is formed over the exposed portions of the n-type layer. A first dielectric layer is formed over the n-electrodes. A transparent conductor layer is formed over the p-type layer and the first dielectric layer. A p-electrode is formed over the transparent conductor layer. A transparent bonding layer is deposited over the transparent conductor layer and the p-electrode. A transparent support substrate is bonded to the p-type layer via the bonding layer. The growth substrate is then removed to expose the n-type layer, and the layers are etched to expose the n and p electrodes for connection to a power source. A reflector layer is formed on the bottom surface of the substrate.

19 Claims, 4 Drawing Sheets

LIGHT EMITTING DIODE HAVING INCREASED LIGHT EXTRACTION

CROSS-REFERENCE TO RELATED APPLICATIONS

This application claims priority to PCT Application CN2012/073024, filed on Mar. 26, 2012 and published on Oct. 4, 2012 as publication WO 2012/130115 A1, which claims priority to Chinese Patent Application No. 201110080882.3, filed on Apr. 1, 2011, entitled "A Flip-chip Light Emitting Diode (LED) and Manufacturing Method Thereof," the contents of which are incorporated herein by reference in its entirety.

FIELD OF THE INVENTION

This invention relates to a light emitting diode (LED) and manufacturing method thereof, and more particularly, to an LED that has improved light extraction efficiency.

BACKGROUND OF THE INVENTION

Some applications of GaN-based LEDs include displays, indication lights, LCD backlights, and general illumination, and luminous efficiencies of such LEDs increase year by year. To improve the drive power and luminous efficiency of the LED, some manufacturers have designed a thin-film chip architecture based on substrate transfer technology, of which the most typical one is the vertical LED chip. The manufacturing method is to epitaxially grow the GaN-based light-emitting material on a growth substrate, such as sapphire, and remove the growth substrate after the light-emitting material layer is bonded to a permanent substrate, such as a semiconductor or a metal substrate via bonding or electroplating. After that, the nitrogen-polar n-GaN top surface is roughened using a wet etch to create micro-pyramid structures in the surface, thus greatly improving the light extraction efficiency. Furthermore, a reflector is provided between the light-emitting material layer and the permanent substrate to facilitate light extraction at the top side by reflecting the downward emissive light.

However, although forming the pyramid-shaped roughened surface on the exposed surface is achievable, the above-described vertical thin-film chip essentially has the top surface as the only light exit surface, since the light emitted from the sides of the relatively-thin epitaxial layers is almost negligible. Therefore, any reflected light must exit through the epitaxial layers and is partially absorbed, resulting in lowered light extraction efficiency.

In contrast to the vertical chip, the conventional horizontal chip, by adopting a transparent substrate structure, consists of at least one front light-emitting surface and four lateral light-emitting surfaces, of which the lateral surfaces emit the most light. Therefore, if the transparent substrate structure of the horizontal chip and the pyramid-shaped roughened surface of the vertical chip are combined together, the extraction efficiency can be improved. Nevertheless, in a conventional horizontal chip based on the transparent substrate structure, a transparent conductive layer, such as an indium tin oxide (ITO) layer, is typically provided as a p-type conductive window, the resistance of which is higher than the metal, thus limiting the current expansion under a high current operation since the lateral transfer resistance is relatively large. For this reason, a metal electrode is required in the light-emitting area, which reduces the extraction efficiency by blocking the light.

What is needed is an LED design that has increased light extraction efficiency.

SUMMARY

The present invention is a light emitting diode (LED) and manufacturing method thereof. By forming a thin-film chip based on substrate transfer technology and a transparent substrate structure, and providing the metal p and n electrodes essentially only in the non-light-emitting areas of the chip, the invention can improve the extraction efficiency. Efficiency is achieved by the increased side light from the bonded transparent substrate and the fact that the electrodes are formed in non-light emitting areas so do not block the light.

The light emitting diode (LED) comprises a thin film light-emitting element and a transparent permanent substrate. The thin film light-emitting element comprises a light-emitting epitaxial layer, a transparent conductive layer, an isolation layer, a p-electrode, and an n-electrode. The epitaxial layers are preferably GaN based.

The light-emitting epitaxial layer comprises, in order, a p-type epitaxial layer, an active layer, and an n-type epitaxial layer and comprises two main surfaces: the p-type surface and the n-type surface. The p-type layer and the active layer are etched to expose the n-type layer for connection to an n-electrode. Where the p-type layer and active layer are etched to expose the n-type layer for connection to n-electrodes, the etched areas are non-light emitting areas.

The n-type epitaxial layer has two main surfaces, of which a first main surface is a light exiting surface and a second main surface is in contact with the active layer. The n-electrode is formed in the non-light-emitting area on the second main surface of the n-type epitaxial layer. An isolation layer (e.g., $SiO_2$) is formed over the n-electrode and the n-type epitaxial layer. A transparent conductive layer is formed over the p-type epitaxial layer, the light-emitting areas, the non-light emitting areas, and the isolation layer. The transparent conductive layer is insulated from the n-electrode and n-type layer by the isolation layer. The p-electrode is formed on the transparent conductive layer and arranged within the non-light-emitting areas. Since the opaque metal electrodes are all formed in non-light emitting areas, the electrodes do not block light, thus improving the efficiency of the LED.

The relatively thick transparent permanent substrate is bonded to the p-type surface of the thin film light-emitting element via a transparent connective (bonding) layer, such as a resin.

The manufacturing method of the light emitting diode (LED) is characterized in that:

1) A light-emitting epitaxial layer is grown on a temporary growth substrate, comprising, in order, a buffer layer, an n-type epitaxial layer, an active layer, and a p-type epitaxial layer;

2) Part of the p-type epitaxial layer and the active layer are etched to expose the n-type epitaxial layer, and the etched areas create the non-light-emitting areas;

3) An n-electrode is deposited on the n-type epitaxial layer in a non-light-emitting area;

4) An isolation layer is deposited to cover the n-electrode and n-type epitaxial layer in a non-light-emitting area;

5) A transparent conductive layer is deposited on the p-type epitaxial layer, covering the light-emitting areas, the non-light emitting areas, and the isolation layer;

6) A p-electrode is deposited on the transparent conductive layer only within the non-light-emitting areas;

7) The light-emitting epitaxial layer is bonded to a permanent transparent substrate via a transparent connective layer;

8) The temporary substrate and buffer layer are removed to expose the light exit surface of the n-type epitaxial layer;

9) The surface of the n-type epitaxial layer is roughened by wet etching to improve light extraction; and 10) A reflector layer is deposited on the back of the transparent substrate to reduce the absorption at the back side and to improve the light extraction through the front and sides of the LED.

Accordingly, the metal current-spreading electrodes (formed as strips) are located in the non-light-emitting areas of the chip, while the LED incorporates the relatively thick transparent substrate. As a result, light absorption by the electrodes is greatly reduced, there is increased light extraction from the sides (reducing absorption by the epitaxial layers), and the exposed n-type layer can easily be roughened to further increase the light extraction.

Wire-bonding areas of the electrodes for electrical contact to the n-type layer and p-type layer are provided by etching parts of the light-emitting epitaxial layer and the transparent conductive layer to expose portions of the p-electrode and the n-electrode.

BRIEF DESCRIPTION OF THE DRAWINGS

The accompanying drawings are included to provide a further understanding of the invention. The same numerals in the various figures are intended to indicate the same or similar elements. The drawings serve to explain the principles of the invention, and the features are not proportional to actual sizes in order to improve clarity.

Figure 1:
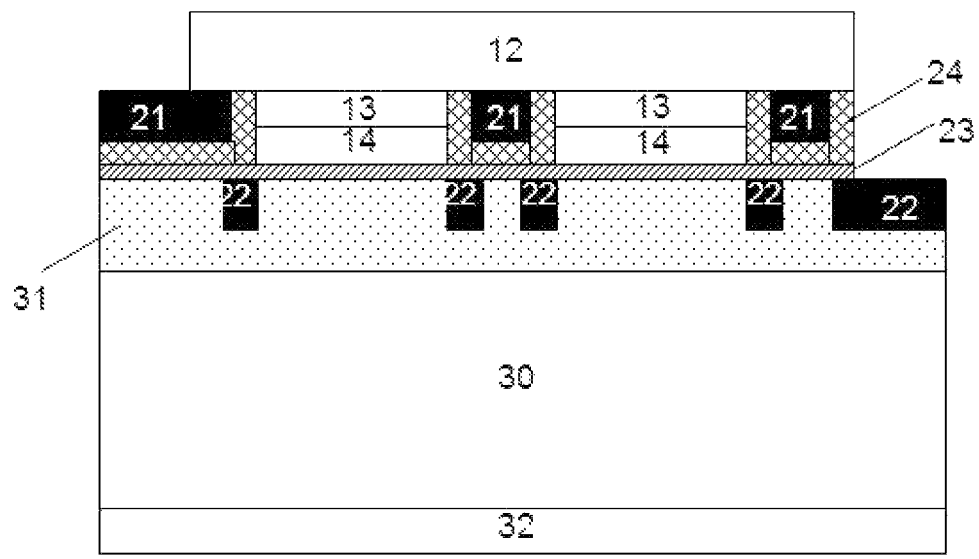
FIG. 1 is a cross-sectional view of the light emitting diode (LED) according to an embodiment of the present invention.

The components in the drawings are listed as follows:
10 Sapphire growth substrate
11 Buffer layer
12 n-type layer (GaN based)
13 Active layer of multiple quantum wells (GaN based)
14 p-type layer (GaN based)
21 N-electrode
22 P-electrode
23 ITO layer
24 $SiO_2$ layer
30 Sapphire permanent substrate
31 Reflector
100 Flip-chip thin film light-emitting element
101 Light-emitting epitaxial layer
110 Light-emitting area
120 Non-light-emitting area

DETAILED DESCRIPTION

Figure 2:
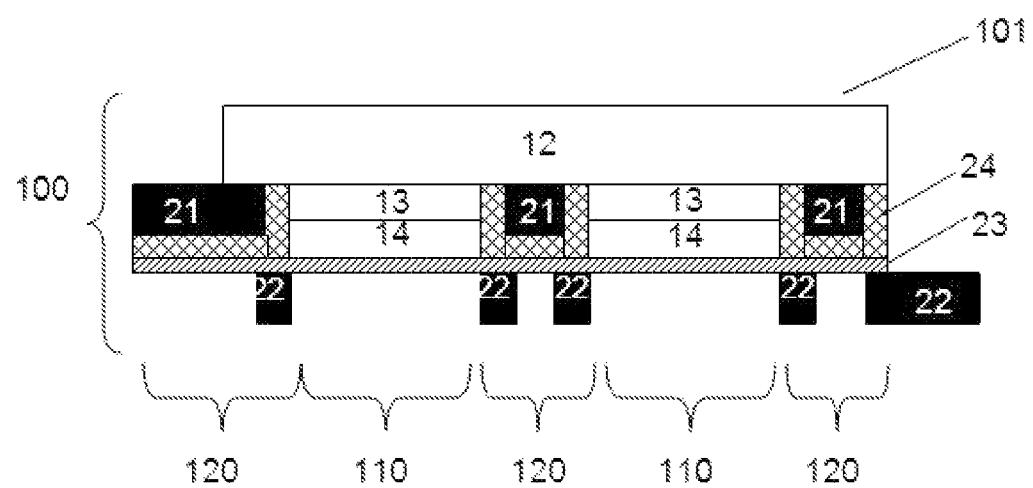
FIG. 2 is a cross-sectional view of the thin film light-emitting element according to an embodiment of the present invention.

Referring to FIG. 1, shown is a cross-sectional view of a preferable light emitting diode (LED) in accordance with this invention. The structure includes a thin film light-emitting element 100 (identified in FIG. 2) and a sapphire permanent substrate 30. The thin film light-emitting element 100 and the sapphire permanent substrate 30 are bonded together with a benzocyclobutene (BCB resin) layer 31. The thin film light-emitting element 100 comprises light-emitting epitaxial layer 101, which, in order, comprises GaN n-type layer 12, an active layer 13 of multiple quantum wells, and a GaN p-type layer 14. The layer 12 and layer 14 may each comprise multiple layers of the same conductivity type. The n-type layer 12 and the p-type layer 14 are positioned at the two ends of the light-emitting epitaxial layer 101. The light-emitting epitaxial layer 101 also comprises light-emitting areas 110 and a non-light-emitting areas 120.

The n-electrode 21 is formed on the n-type layer 12 in the non-light-emitting area 120, and the $SiO_2$ layer 24, as an isolation layer, is formed on the n-electrode 21 and n-type layer 12.

An ITO layer 23, as a transparent conductive layer, is formed on the p-type layer 14 and the $SiO_2$ isolation layer 24 in the light-emitting area 110 and the non-light emitting area 120, and is electrically insulated from the n-type layer 12 and n-electrode 21 by the $SiO_2$ isolation layer 24. The p-electrode 22 is formed on the ITO layer 23 within the non-light-emitting area 120. The ITO layer 23 carries current from the p-electrode 22 horizontally to the p-type layer 14. Since the opaque metal n-electrode 21 and p-electrode 22 are only formed in the non-light emitting areas 120, they do not block light. Therefore, light extraction efficiency is increased.

As would already be understood by viewing FIG. 1, the metal electrodes 21 and 22 are formed as strips going into and out of the paper and spread the current across the LED. The parallel strips are connected to associated perpendicular anode and cathode busses along the edges (in non-light emitting areas), and the busses are connected to the respective anode and cathode wire bond electrode areas at the opposite edges of the die.

The sapphire permanent substrate 30 is bonded to the p-type end of the thin film light-emitting element 100 via the dielectric, transparent benzocyclobutene (BCB resin) layer 31. The transparent substrate 30 is much thicker than the epitaxial layers, such as at least five times thicker, so the light emitted from the thicker sides of the LED is greatly increased, as compared to vertical LEDs, previously discussed.

A reflector layer 32 abuts the back of the sapphire permanent substrate 30. The reflector layer 32 may be deposited on the substrate 30 or may be part of a separate structure abutting against the substrate 30.

The manufacturing method of the preferable embodiment of a light emitting diode (LED) shown in FIG. 1 is described below.

Figure 3:
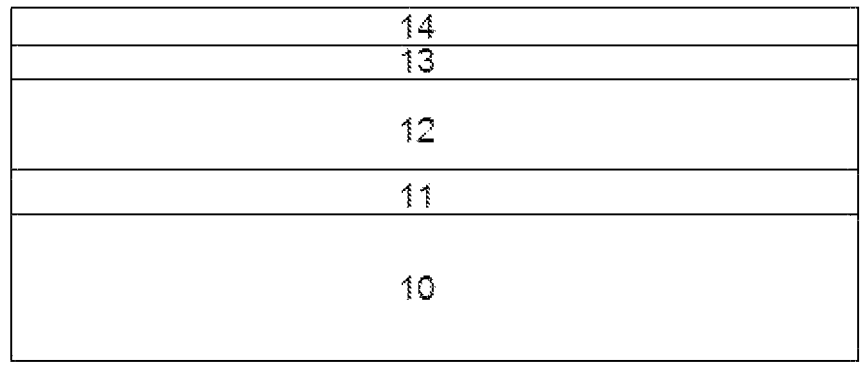
FIGS. 3, 4, 5, 6, 7 and 8 are the cross-sectional views during the manufacturing of the light emitting diode (LED) according to an embodiment of the present invention.

Referring to FIG. 3, the light-emitting epitaxial layer is grown on the sapphire growth substrate 10. During the process, the following layers are grown, in order: a buffer layer 11, an n-type layer 12, an active layer 13 of multiple quantum wells, and a p-type layer 14 by means of metal-organic chemical vapor deposition (MOCVD).

Figure 4:
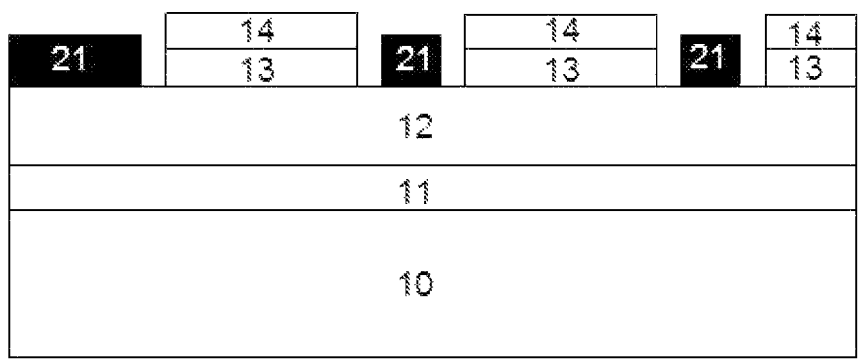

Referring to FIG. 4, a light-emitting area is defined by removing part of the active layer 13 of multiple quantum wells and the p-type layer 14 and by exposing the n-type layer 12 via reactive ion etching (RIE). The etched area is the non-light-emitting area. An n-electrode 21 is formed on the n-type layer 12 of the non-light-emitting area by Cr/Pt/Au layers.

Figure 5:
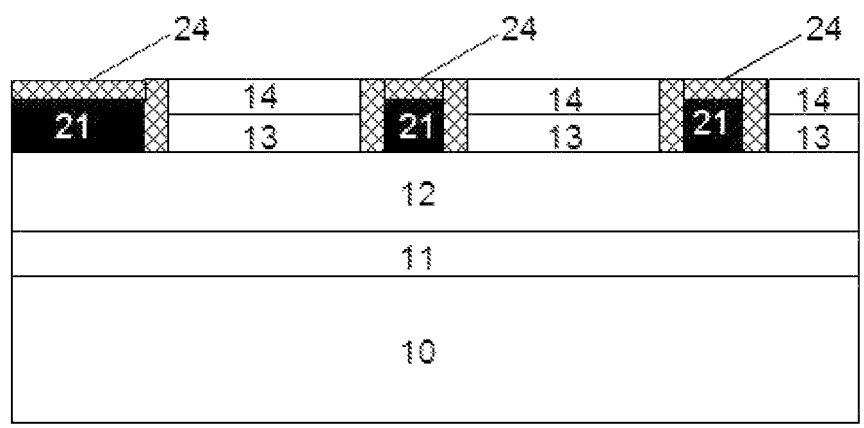

Referring to FIG. 5, a $SiO_2$ layer of about 500 nm thick is deposited through plasma enhanced chemical vapor deposition (PECVD). The $SiO_2$ in the light-emitting area is removed by etching, and the remaining $SiO_2$ layer 14 is provided as an isolation layer covering the n-electrode 21 and the n-type epitaxial layer 12 within the non-light-emitting area.

Figure 6:
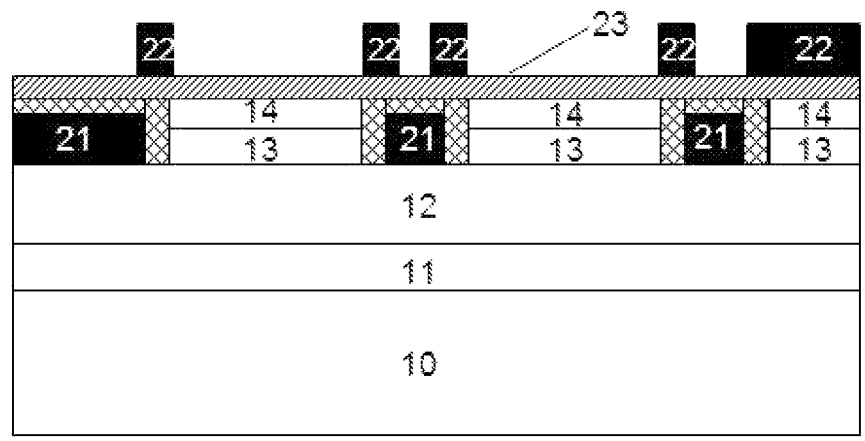

Referring to FIG. 6, indium tin oxide (ITO) is evaporated on the p-type layer 14 and the $SiO_2$ layer 24 in the light-emitting areas and non-light emitting areas by means of electron beam evaporation and provided as a 250 nm transparent conductive layer 23. A p-electrode 22 is formed on the ITO layer 23 within the non-light-emitting area by Cr/Pt/Au layers.

Figure 7:
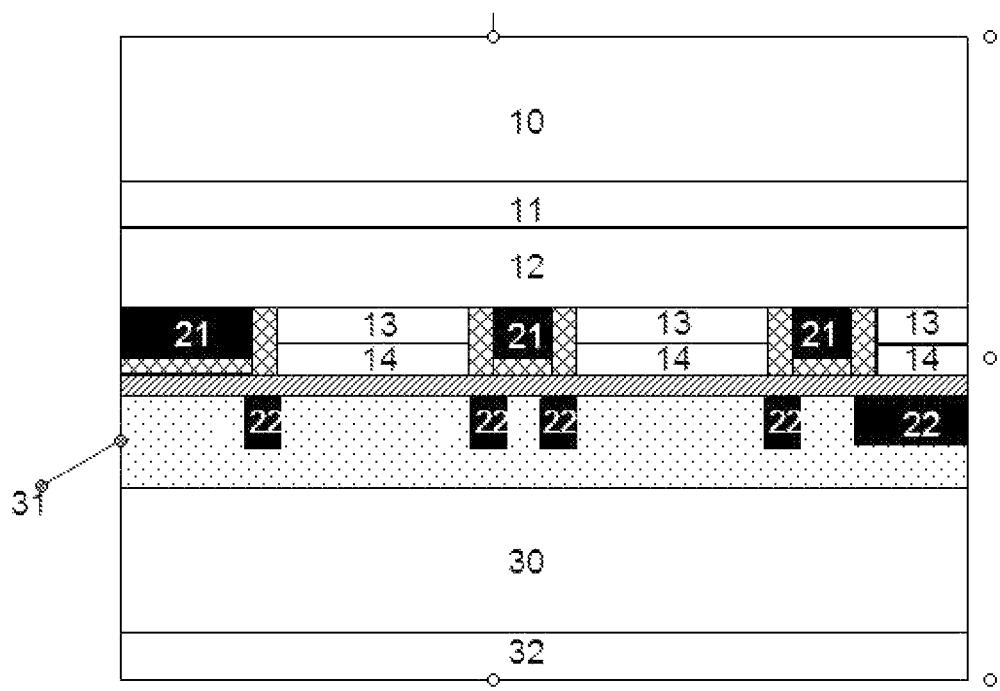

Referring to FIG. 7, the light-emitting epitaxial layer is bonded to a sapphire permanent substrate 30 via a benzocyclobutene (BCB resin) layer 31. A 300 nm thick reflector 32 comprising Al is deposited on the back of the sapphire permanent substrate 30.

Figure 8:
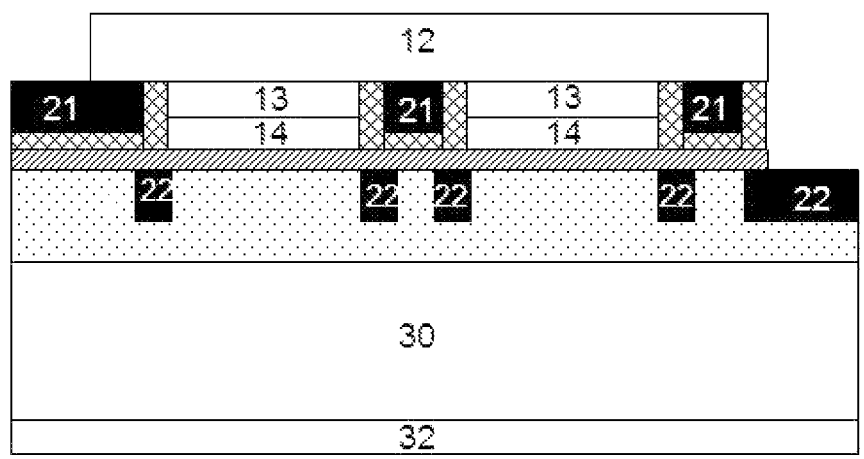

Referring to FIG. 8, the sapphire growth substrate 10 is removed by laser lift-off (LLO), and the buffer layer 11 is removed by reactive ion etching (RIE).

A cathode wire bonding area is provided by etching part of the n-type layer 12 via photolithography and reactive ion etching (RIE) to expose part of the n-electrode 21, and an anode wire bonding area is provided by etching part of the n-type layer 12, the active layer 13, the p-type layer 14, and the ITO layer 23 to expose part of the p-electrode 22 via photolithography, RIE, and wet etching.

After removal of the sapphire growth substrate 10 and the buffer layer 11, the n-type layer 12 can go through a wet etch roughening process to further improve the extraction efficiency by generating a pyramid-shaped surface microstructure, the sizes of which are similar to the light-emitting wavelength, thus greatly improving the extraction efficiency of LED.

The above-described embodiments of the present invention are possible examples of implementations. This invention should not be construed as limited to the embodiments set forth herein, and the claims will fully convey the scope of the invention to those skilled in the art.

The invention claimed is:

1. A light emitting diode (LED) structure comprising:
   an epitaxial p-type layer;
   an epitaxial n-type layer, light generated by the LED structure exiting through the n-type layer;
   an epitaxial active layer between the p-type layer and the n-type layer, wherein the p-layer and the active layer are etched at one or more first areas to expose the n-type layer for connection to an n-electrode, and wherein the one or more first areas create one or more non-light emitting areas;
   a metal n-electrode electrically contacting the n-type layer through the one or more first areas;
   a transparent conductor layer formed on the p-type layer;
   a metal p-electrode formed on the transparent conductor layer and electrically contacting the p-type layer via the transparent conductor layer, the p-electrode being located in the one or more non-light emitting areas so as not to substantially block light;
   a dielectric, transparent bonding layer, the p-electrode being within the bonding layer with a portion of the p-electrode being exposed on a surface of the LED structure for connection to a power source, and the n-electrode being above the bonding layer with a portion of the n-electrode being exposed on a surface of the LED structure for connection to the power source;
   a transparent support substrate bonded to the p-layer by at least the bonding layer, the transparent support substrate being thicker than the epitaxial layers; and
   a reflector opposing a bottom surface of the substrate, wherein light emitted by the active layer in the direction of the n-type layer exits through the n-type layer, and wherein light emitted by the active layer in the direction of the substrate is reflected upwards by the reflector and exits through the n-type layer.

2. The structure of claim 1 wherein the transparent conductor conducts current in a generally horizontal direction between the p-electrode and the p-type layer.

3. The structure of claim 1 wherein there are a plurality of first areas creating a plurality of non-light emitting areas, wherein portions of the p-electrode are located in the non-light emitting areas.

4. The structure of claim 1 wherein of the exposed portion of the p-electrode is a wire bond terminal, and wherein the exposed portion of the n-electrodes is another wire bond terminal.

5. The structure of claim 1 wherein the reflector is formed on the substrate.

6. The structure of claim 1 wherein the n-electrode is insulated from the p-layer, the active layer, and the transparent conductor by a dielectric.

7. The structure of claim 1 wherein the bonding layer is a resin.

8. The structure of claim 1 wherein the substrate is sapphire.

9. The structure of claim 1 wherein the p-electrode is arranged as strips on the transparent conductor.

10. The structure of claim 1 wherein the n-electrode is arranged as strips on the n-type layer.

11. The structure of claim 1 wherein the n-layer has a roughened surface for increasing light extraction.

12. The structure of claim 1 wherein the n-type layer, the p-type layer, and the active layer are GaN based.

13. A method for forming a light emitting diode (LED) structure comprising:
   epitaxially growing an n-type layer over a growth substrate;
   epitaxially growing an active layer over the n-type layer;
   epitaxially growing a p-type layer over the active layer;
   etching away portions of the p-type layer and active layer at one or more first areas to expose the n-type layer for connection to one or more n-electrodes, and wherein the one or more first areas create one or more non-light emitting areas;
   forming a metal n-electrode over the exposed portions of the n-type layer, in the one or more first areas, to electrically contact the n-type layer;
   providing a first dielectric layer over the n-electrode;
   depositing a transparent conductor layer over the p-type layer and the first dielectric layer;
   forming a metal p-electrode over the transparent conductor layer to electrically contact the p-type layer, the p-electrode being located in the one or more non-light emitting areas so as not to substantially block light;
   depositing a dielectric, transparent bonding layer over the transparent conductor layer and the p-electrode;
   bonding a transparent support substrate to the p-type layer via the bonding layer, the transparent support substrate being thicker than the epitaxial layers;
   removing at least the growth substrate to expose the n-type layer; and
   etching away portions of the n-type layer, the p-type layer, and the active layer to expose a portion of the n-electrode for connection to a power source and expose a portion of the p-electrode for connection to the power source.

14. The method of claim 13 further comprising forming a reflective layer on a bottom surface of the support substrate, wherein light emitted by the active layer in the direction of the n-type layer exits through the n-type layer, and wherein light emitted by the active layer in the direction of the support substrate is reflected upwards by the reflector and exits through the n-type layer.

15. The method of claim 13 further comprising growing a buffer layer between the n-type layer and the growth substrate.

16. The method of claim 13 wherein of the exposed portion of the p-electrodes is a wire bond terminal, and wherein the exposed portion of the n-electrode is a wire bond terminal.

17. The method of claim 13 wherein the bonding layer is a resin.

18. The method of claim 13 wherein the p-electrode is arranged as strips on the transparent conductor.

19. The method of claim 13 wherein the n-electrode is arranged as strips on the n-type layer.

\* \* \* \* \*